(12) United States Patent
Nagashima et al.

(10) Patent No.: US 12,367,133 B2
(45) Date of Patent: Jul. 22, 2025

(54) APPARATUSES AND METHODS FOR TRAINING OPERATIONS

(71) Applicant: MICRON TECHNOLOGY, INC., Boise, ID (US)

(72) Inventors: Osamu Nagashima, Kanagawa (JP); Yoshinori Matsui, Kanagawa (JP); Keun Soo Song, Boise, ID (US); Hiroki Takahashi, Tokyo (JP); Shunichi Saito, Kanagawa (JP)

(73) Assignee: Micron Technology, Inc., Boise, ID (US)

(*) Notice: Subject to any disclaimer, the term of this patent is extended or adjusted under 35 U.S.C. 154(b) by 209 days.

(21) Appl. No.: 18/353,639

(22) Filed: Jul. 17, 2023

(65) Prior Publication Data

US 2024/0078173 A1  Mar. 7, 2024

Related U.S. Application Data

(60) Provisional application No. 63/369,612, filed on Jul. 27, 2022.

(51) Int. Cl.
| | |
|---|---|
| *G06F 12/02* | (2006.01) |
| *G06F 1/08* | (2006.01) |
| *G06F 1/12* | (2006.01) |
| *G11C 11/4076* | (2006.01) |

(52) U.S. Cl.
CPC .............. *G06F 12/023* (2013.01); *G06F 1/08* (2013.01); *G06F 1/12* (2013.01); *G11C 11/4076* (2013.01)

(58) Field of Classification Search
CPC . G06F 12/023; G06F 1/08; G06F 1/12; G06F 1/206; G11C 11/4076; G11C 11/4072; G11C 7/04; G11C 7/222; G11C 11/4096; G11C 11/4093
USPC ...................................... 365/233.1
See application file for complete search history.

(56) References Cited

U.S. PATENT DOCUMENTS

| | | | |
|---|---|---|---|
| 2007/0133339 A1* | 6/2007 | Jeong .................. | G11C 11/4096 365/194 |
| 2008/0123454 A1* | 5/2008 | Bae ........................ | G11C 5/063 365/206 |
| 2021/0193198 A1* | 6/2021 | Johnson ................. | G11C 7/222 |
| 2023/0091026 A1* | 3/2023 | Kavala .................... | H03L 7/085 365/193 |
| 2023/0206974 A1* | 6/2023 | Kim ..................... | G11C 11/4076 713/400 |
| 2023/0223941 A1* | 7/2023 | Lee ...................... | G11C 11/4076 |

(Continued)

*Primary Examiner* — Fernando Hidalgo
(74) *Attorney, Agent, or Firm* — Dorsey & Whitney LLP

(57) ABSTRACT

A training operation may be performed by a memory controller to provide a system clock signal and a data clock signal having a desired temporal (e.g., phase) relationship to one another. The system clock and data clock signals may be provided to a memory. In some examples, the memory controller may provide a command to the memory to put the memory in a training mode. Once in the training mode, the memory controller may provide a write command and toggle the data clock signal a number of times. If the memory provides one output, the memory controller may adjust the relationship between the data clock and system clock signals. If the memory provides another output, the memory controller may maintain the relationship between the data clock and system clock signals and exit the training mode.

20 Claims, 8 Drawing Sheets

(56) References Cited

U.S. PATENT DOCUMENTS

| | | | |
|---|---|---|---|
| 2023/0305706 A1* | 9/2023 | Oh | G11C 11/4076 |
| 2023/0360689 A1* | 11/2023 | Park | G11C 11/4076 |
| 2023/0377667 A1* | 11/2023 | Lee | G11C 29/022 |
| 2024/0029768 A1* | 1/2024 | Go | G11C 29/028 |

* cited by examiner

APPARATUSES AND METHODS FOR TRAINING OPERATIONS

CROSS REFERENCE TO RELATED APPLICATION(S)

This application claims the benefit, under 35 U.S.C. § 119(e), of U.S. Provisional Patent Application No. 63/369,612, filed Jul. 27, 2022. The aforementioned application is incorporated herein by reference, in its entirety, for any purpose.

BACKGROUND

Semiconductor memories are used in many electronic systems to store data that may be retrieved at a later time. As the demand has increased for electronic systems to be faster, have greater computing ability, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, and clock signals. The various signals may be provided by a memory controller, for example. The command signals may control the semiconductor memories to perform various memory operations, for example, a read operation to retrieve data from a memory, and a write operation to store data to the memory. Memories may be provided with system clock signals that are used for timing command signals and address signals, for example, and further provided with data clock signals that are used for timing read data provided by the memory and for timing write data provided to the memory.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

With newly developed memories, the memories may be provided with system clock signals (which may be indicated by CK) that are used for timing command signals and address signals, for example, and further provided with data clock signals (which may be indicated by WCK) that are used for timing read data provided by the memory and for timing write data provided to the memory. The WCK signals are provided at a higher frequency than the CK signals (e.g., 2×CK, 4×CK). The memory uses the higher frequency WCK signals to generate internal data clock signals (IWCK) to time the writing of data to and reading of data from the memory.

Typically, in order for the memory to operate properly, the memory must frequently perform a clock synchronization operation to determine a temporal (e.g., phase) relationship between the system clock and data clock signals. However, the frequent clock synchronization operations may increase the time of access operations and/or reduce the time the memory is available for performing operations. Accordingly, improved techniques for providing the relationship between the system clock and data clock signals may be desirable.

Figure 1:
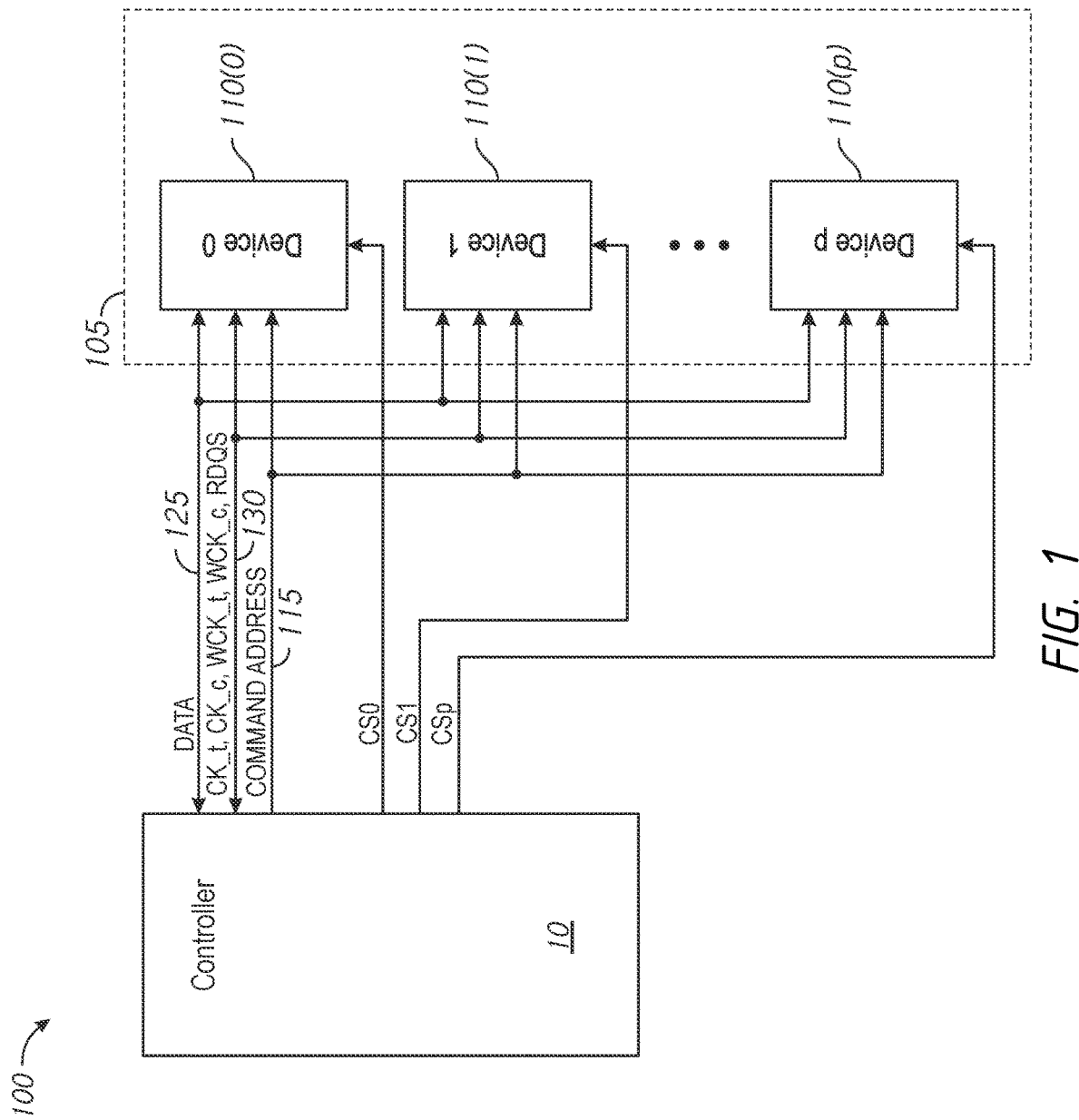
FIG. 1 is a block diagram of a system according to an embodiment of the disclosure.

FIG. 1 is a block diagram of a system 100 according to an embodiment of the disclosure. The system 100 includes a controller 10 and a memory system 105. The system 100 may be included in a computing system which may include a processor (not shown) that communicates with controller 10 and/or includes controller 10. The memory system 105 includes memories 110(0)-110(p) (e.g., "Device0" through "Devicep"), where p is a non-zero whole number. The memories 110(0)-110(p) are each coupled to the command/address, data, and clock busses. In some embodiments of the disclosure the memories 110(0)-110(p) are organized as ranks of memory. In such embodiments, the memories may be accessed by the ranks of memory. A rank may include one or more of the memories in some embodiments (e.g., one rank may include memory 110(0) and another rank includes memory 110(1)). A rank may include one or more portions of one or more of the memories in some embodiments (e.g., one or more banks of one or more of the memories). Other rank organizations may be used in other embodiments. The controller 10 and the memory system 105 are in communication over several communication busses. For example, commands and addresses are received by the memory system 105 on a command/address bus 115, and data is provided between the controller 10 and the memory system 105 over a data bus 125. Various clock signals may be provided between the controller and memory system 105 over a clock bus 130. The clock bus 130 may include signal lines for providing system clock signals CK_t and CK_c from the controller 10 and received by the memory system 105, providing data clock signals WCK_t, and WCK_c from the controller 10 and received by the memory system 105, and providing an access data clock signal RDQS from memory system 105 to the controller 10. Each of the busses may include one or more signal lines on which signals are provided.

The CK_t and CK_c signals provided by the controller 10 to the memory system 105 are used for timing the provision and receipt of the commands and addresses. In some embodiments, the controller 10 continuously provides active CK_t and CK_c signals when interacting with the memory system 105. The WCK_t and WCK_c signals and the RDQS signal are used for timing the provision of data between the controller 10 and the memory system 105 (e.g., write data from the controller 10 to the memory system 105 and read data from the memory system 105 to the controller 10). In some embodiments, the controller 10 may provide active WCK_t and WCK_c signals for access operations (e.g., read and/or write operations), but may provide inactive (e.g., static) WCK_t and WCK_c signals at other times, such as when non-access operations are performed. That is, the controller 10 may not continuously provide active WCK_t and WCK_c signals to the memory system 105. This may reduce power consumption of the system 100 in some applications.

The CK_t and CK_c signals are complementary to one another and the WCK_t and WCK_c signals are complementary to one another. Clock signals are complementary when a rising edge of a first clock signal occurs at the same time as a falling edge of a second clock signal, and when a rising edge of the second clock signal occurs at the same time as a falling edge of the first clock signal. Additionally, the WCK_t and WCK_c clock signals may have a higher clock frequency than the CK_t and CK_c signals in some embodiments. For example, in some embodiments of the disclosure, the WCK_t and WCK_c signals have a clock frequency that is four times the clock frequency of the CK_t and CK_c signals. In another example, in some embodiments of the disclosure, the WCK_t and WCK_c signals have a clock frequency that is two times the clock frequency of the CK_t and CK_c signals. The WCK_t and WCK_c signals may be provided by the controller 10 to the memory system 105 for access operations which may improve timing performance for the access operations.

The controller 10 provides commands to the memory system 105 to perform memory operations. Non-limiting examples of memory commands include timing commands for controlling the timing of various operations, access commands for accessing the memory, such as read commands for performing read operations and write commands for performing write operations, mode register write and read commands for performing mode register write and read operations, as well as other commands and operations. The command signals provided by the controller 10 to the memory system 105 further include select signals (e.g., chip select CS signals CS0, CS1, CSp). While all of the memories 110 are provided the commands, addresses, data, and clock signals, the select signals provided on respective select signal lines are used to select which of the memories 110 will respond to the command and perform the corresponding operation. In some embodiments of the disclosure, a respective select signal is provided to each memory 110 of the memory system 105. The controller 10 provides an active select signal to select the corresponding memory 110. While the respective select signal is active, the corresponding memory 110 is selected to receive to the commands and addresses provided on the command and address busses 115 and 120.

Mode register write commands may be issued by the controller 10 to one or more of the memories 110 to control one or more operating conditions of the memories 110. For example, writing particular values to a mode register (not shown in FIG. 1) of a selected memory 110 may set a read latency and/or write latency of the memory 110. In another example, writing one or more values to the mode register may cause the memory to operate at a particular frequency set point and use appropriate operation parameters for the particular frequency set point. In a further example, writing one or more values to the mode register may put the memory 110 into a particular mode of operation such as a training mode.

Mode register read commands may be issued by the controller 10 to one or more of the memories 110 to receive data stored in the mode register. The controller 10 may use the data stored in the mode register to determine an operating mode and/or settings of various parameters of the memory 110. For example, the controller 10 may issue a mode register read command to determine results provided by a duty cycle monitor of the memory 110. In a further example, the controller 10 may issue a mode register read command to determine whether a calibration operation has been completed.

In "normal" operation, when a read command and associated address are provided by the controller 10 to the memory system 105, the memory 110 selected by the select signals receives the read command and associated addresses, and performs a read operation to provide the controller 10 with read data from a memory location corresponding to the corresponding addresses.

In preparation of the selected memory 110 providing the read data to the controller 10, the controller provides active WCK_t and WCK_c signals to the memory system 105. The WCK_t and WCK_c signals may be used by the selected memory 110 to generate an access data clock signal RDQS. A clock signal is active when the clock signal transitions between low and high clock levels periodically (e.g., toggles). Conversely, a clock signal is inactive when the clock signal maintains a constant clock level and does not transition periodically (e.g., static). The RDQS signal is provided by the memory 110 performing the read operation to the controller 10 for timing the provision of read data to the controller 10.

The controller 10 may use the RDQS signal for receiving the read data. In some embodiments of the disclosure, the controller 10 has two modes for using the RDQS signal for receiving the read data. In a first mode, the controller 10 may use the RDQS signal to control the timing of circuitry for capturing the read data from the selected memory 110. In a second mode, the controller 10 may recover a clock timing from the RDQS signal and generate an internal timing signal based on the recovered timing. The internal timing signal may then be used by the controller 10 to control the timing of circuitry for capturing the read data from the selected memory 110.

In normal operation, when a write command and associated address are provided by the controller 10 to the memory system 105, the memory 110 selected by the select signals receives the write command and associated addresses, and performs a write operation to write data from the controller 10 to a memory location corresponding to the corresponding addresses. In preparation of the selected memory 110 receiving the write data from the controller 10, the controller 10 provides active (e.g., toggling) WCK_t and WCK_c signals to the memory system 105. After the data clock signals are activated, the controller 10 may provide the write data to the selected memory 110. The WCK_t and WCK_c signals may be used by the selected memory 110 to generate internal clock signals for timing the operation of circuits to receive the write data. The data is provided by the controller 10 and the selected memory 110 receives the write data, which is written to memory corresponding to the memory addresses.

For the selected memory 110 to properly perform an access operation, the system clock signals CK_t and CK_c and the data clock signals WCK_t and WCK_c may be required to have a particular temporal (e.g., phase) relationship and/or a known relationship to one another.

According to embodiments of the present disclosure, a training operation may be performed to establish a desired relationship between the system clock signals and the data clock signals. In some embodiments, the desired relationship may be a phase or other temporal relationship that permits the selected memory 110 to operate properly. For example, the desired relationship may allow the selected memory 110 to generate internal clock signals for the provision of data between the selected memory 110 and the controller 10.

The controller 10 may cause the selected memory 110 to enter a training mode, for example, by issuing one or more commands to the memory 110. In some embodiments, in the training mode, the memory 110 may operate differently and/or respond to commands from the controller 10 differently than when in "normal" operation. As part of the training operation, the controller 10 may adjust (e.g., delay) one of the clock signals relative to the other until the desired relationship is achieved. For example, the controller 10 may delay the data clock signals WCK_t and WCK_c relative to the system clock signals CK_t and CK_c until the desired relationship is achieved. In some embodiments, the selected memory 110 may provide an output to the controller 10 when the desired relationship is achieved. After the training operation has been completed, in some embodiments, the controller 10 may cause the memory 110 to return to "normal" operation.

In some embodiments, the controller 10 may issue a mode register write command to the selected memory 110 to cause a value to be written to a mode register of the selected memory 110. The value written to the mode register may put the selected memory 110 into a training mode. In some embodiments, the controller 10 may then issue a write command to the selected memory 110. Following the write command, the controller 10 may toggle the data clock signal a number of times (e.g., 4, 5, 6, 8, etc.). Toggling may generate a same number of pulses of the data clock signal. Each pulse may include a rising edge, a plateau, and a falling edge. Rather perform a write operation as described during normal operation, in the training mode, the selected memory 110 may provide an output based, at least in part, on a relationship of the clock signals. In some embodiments, the memory 110 may provide the output at one or more DQ terminals coupled to data bus 125.

If the output is a first state, it may indicate that a phase relationship between the system clock signals and the data clock signals is not the desired relationship. Responsive to the first state, the controller 10 may adjust a phase of the data clock signal and again toggle the data clock signal the number of times. In some embodiments, the controller 10 may issue another write command prior to toggling the data clock signal again. If the output of the memory 110 is in a second state, it may indicate that the phase relationship between the system clock signals and the data clock signals is desirable. Responsive to the second state, the controller 10 may maintain the current relationship of the clock signals. Responsive to the second state, the controller 10 may issue another mode register write command to the selected memory 110 to cause a value to be written to the mode register of the selected memory 110. The value written to the mode register may cause the selected memory 110 to exit the training mode.

In some embodiments, the training operation may be performed by the controller 10 upon power-up and/or initialization of the system 100, memory system 105, and/or selected memory 110. In some embodiments, power-up and/or initialization may be the only time at which the training operation is performed. In some embodiments, the training operation may be performed at other times, for example, responsive to a temperature change and/or a change in operating conditions (e.g., change in frequency of operation memory 110, change in frequency of the system or data clock signals). Although the training operation is described with reference to a selected memory 110, in some embodiments, the controller 10 may perform the training operation on multiple ones of the memories 110 at least partially concurrently.

The controller 10 may adjust the system clock and/or the data clock during the training operation such that the system clock and data clock signals may be put in a desired relationship. In some applications, having the controller 10 adjust one or more clock signals may reduce or eliminate the need for the memories 110 to perform clock synchronization operations. Furthermore, a number of training operations required for the memories 110 to operate properly may be less than a number of clock synchronization operations required. In some applications, reducing or eliminating the number of clock synchronization operations performed by the memories 110 may improve performance of the memory system 105, for example, by increasing an amount of time the memories 110 are available to perform other operations (e.g., read/write operations).

Figure 2:
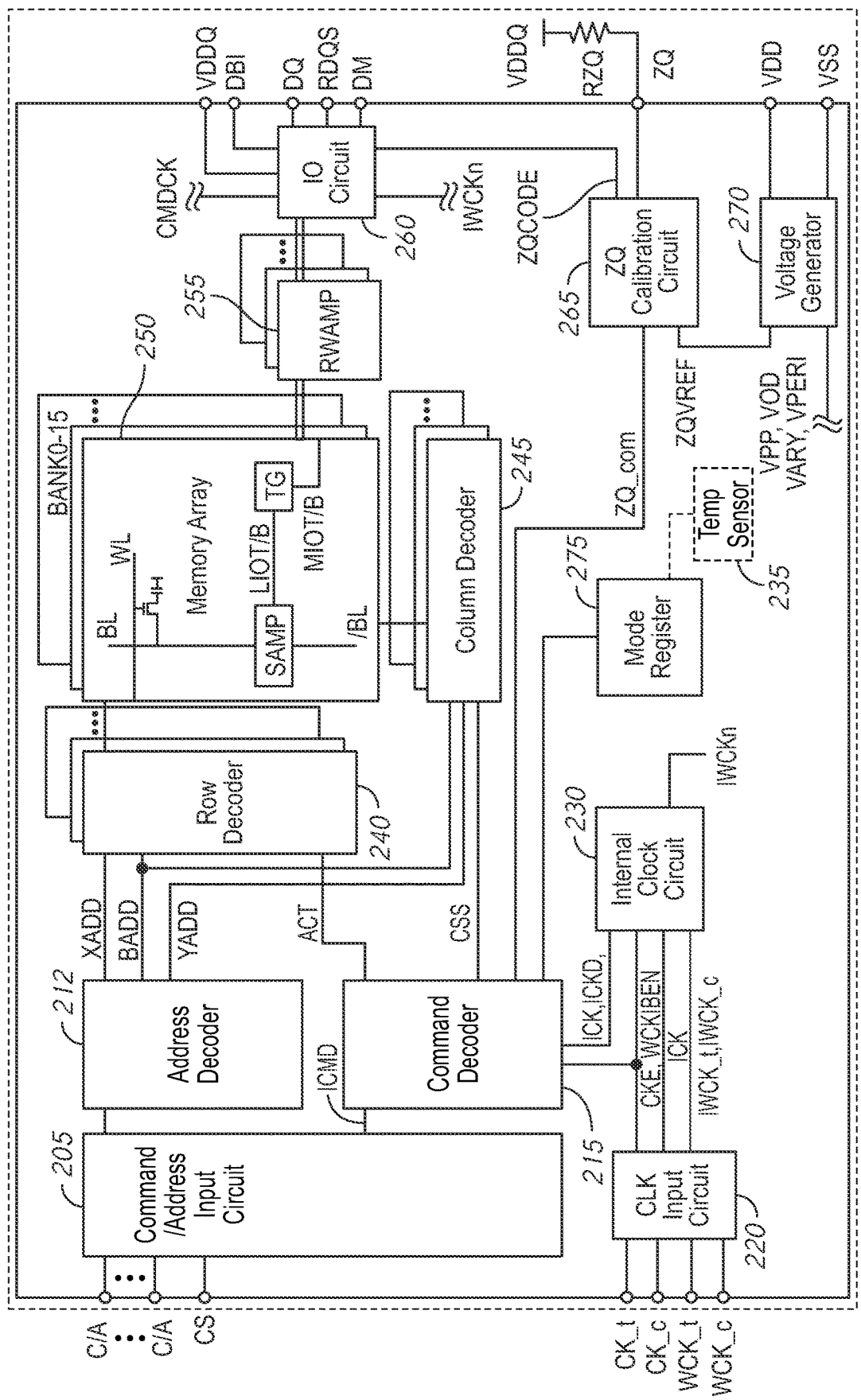
FIG. 2 is a block diagram of an apparatus according to an embodiment of the disclosure.

FIG. 2 is a block diagram of an apparatus according to an embodiment of the disclosure. The apparatus may be a semiconductor device 200, and will be referred as such. In some embodiments, the semiconductor device 200 may include, without limitation, a dynamic random access (DRAM) device, such as low power double data rate (LPDDR) memory integrated into a single semiconductor chip, for example. The semiconductor device 200 may be included in the memory system 105 of FIG. 1 in some embodiments of the disclosure. For example, each of the memories 110 may include a semiconductor device 200. The semiconductor device 200 includes a memory die. The die may be mounted on an external substrate, for example, a memory module substrate, a mother board or the like. The semiconductor device 200 may further include a memory array 250. The memory array 250 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 240 and the selection of the bit line BL is performed by a column decoder 245. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 200 may employ a plurality of external terminals that include command and address terminals coupled to a command/address (C/A) bus to receive command and address signals, clock terminals to receive clock signals CK_t and CK_c, data clock terminals to receive data clock signals WCK_t and WCK_c, data terminals DQ, RDQS, DBI, and DMI, power supply terminals VDD, VSS, VDDQ, and VSSQ, and the ZQ calibration terminal (ZQ).

The C/A terminals may be supplied with an address and a bank address signal from outside. The address signal and the bank address signal supplied to the address terminals are transferred, via a command/address input circuit 205, to an address decoder 212. The address decoder 212 receives the address signals and supplies a decoded row address signal XADD to the row decoder 240, and a decoded column address signal YADD to the column decoder 245. The address decoder 212 also receives the bank address signal BADD and supplies the bank address signal to the row decoder 240 and the column decoder 245.

The C/A terminals may further be supplied with command signals from, for example, a memory controller, such as controller 10 of FIG. 1. The command signals may be provided as internal command signals ICMD to a command decoder 215 via the command/address input circuit 205. The command decoder 215 includes circuits to decode the internal command signals ICMD to generate various internal signals and commands for performing operations, for example, a row activation signal (ACT) to select a word line and a column select signal (CSS) to select a bit line. Another example may be providing internal signals to enable circuits for performing operations, such as control signals to enable signal input buffers that receive clock signals. The internal commands also include output and input activation commands.

The command decoder 215 may access mode register 275 that is programmed with information for setting various modes and features of operation for the semiconductor device 200. In some embodiments, mode register 275 may include multiple registers. For example, the mode register 275 may be programmed with information related to data access latency, such as read latency or write latency. As another example, the mode register 275 may be programmed with information related to data burst length. The data burst length defines a number of data bits provided from or to each of the data terminals DQ per access operation (e.g., read or write operation). As another example, the mode register 275 may be programmed with information for modes related to monitoring internal data clocks that are generated by the internal cock circuit 230 based on the WCK_t and WCK_c clocks, as well as information for modes related to changing a timing of the internal data clocks, such as the duty cycle of the internal data clocks.

The information in the mode register 275 may be programmed by providing the semiconductor device 200 a mode register write command, which causes the semiconductor device 200 to perform a mode register write operation. In some embodiments, data to be written to the mode register 275 is provided via the C/A terminals and/or the DQ terminals. The command decoder 215 accesses the mode register 275, and based on the programmed information along with the internal command signals provides the internal signals to control the circuits of the semiconductor device 200 accordingly. Information programmed in the mode register 275 may be externally provided by the semiconductor device 200 using a mode register read command, which causes the semiconductor device 200 to access the mode register 275 and provide the programmed information (e.g., to the memory controller). In some embodiments, the information may be provided via the C/A terminals and/or the DQ terminals.

During normal operation, when a read command is issued and a row address and a column address are timely supplied with the read command, read data is read from a memory cell in the memory array 250 designated by these row address and column address. The read command is received by the command decoder 215, which provides internal commands to input/output circuit 260 so that read data is output to outside from the data terminals DQ, DBI, and DMI via read/write amplifiers 255 and the input/output circuit 260 according to the RDQS clock signals.

During normal operation, when a write command is issued and a row address and a column address are timely supplied memory controller, such as controller 10, write data is written to the memory cell in the memory array 250 designated by these row address and column address. The write data is supplied from the controller to the data terminals DQ, DBI, and DMI according to the WCK_t and WCK_c clock signals. The activation and write commands are received by the command decoder 215, which provides internal commands to the input/output circuit 260 so that the write data is received by data receivers in the input/output circuit 260, and supplied via the input/output circuit 260 and the read/write amplifiers 255 to the memory array 250.

Turning to the explanation of the external terminals included in the semiconductor device 200, the clock terminals and data clock terminals are supplied with external clock signals and complementary external clock signals. The external clock signals CK_t, CK_c, WCK_t, WCK_c may be supplied to a clock input circuit 220. When enabled, input buffers included in the clock input circuit 220 pass the external clock signals. For example, an input buffer passes the CK_t and CK_c signals when enabled by a CKE signal from the command decoder 215 and an input buffer passes the WCK_t and WCK_c signals when enabled by a WCKIBEN signal from the command decoder 215. The clock input circuit 220 may use the external clock signals passed by the enabled input buffers to generate internal clock signals ICK and IWCK_t and IWCK_c. The internal clock signals ICK and IWCK_t and IWCK_c are supplied to internal clock circuits 230.

The internal clock circuits 230 includes circuits that provide various phase and frequency controlled internal clock signals based on the received internal clock signals. For example, the internal clock circuits 230 may include a clock path (not shown in FIG. 2) that receives the ICK clock signal and provides internal clock signals ICK and ICKD to the command decoder 215. Although referred to as ICK and ICKD, in some embodiments, ICK and ICKD may include complementary signals. For example, ICK may include ICK_t and ICK_c and ICKD may include ICD_t and ICKD_c in some embodiments. The internal clock circuits 230 may further include a data clock path that receives the IWCK_t and IWCK_c clock signals and/or ICK and ICKD signals and provides multiphase clock signals IWCKn. As will be described in more detail below, the multiphase clock signals IWCKn have relative phases with each other. The multiphase clock signals IWCKn may also be provided to the input/output circuit 260 for controlling an output timing of read data and the input timing of write data. The input/output circuit 260 may include clock circuits and driver circuits for generating and providing the RDQS signal to a controller.

The power supply terminals are supplied with power supply potentials VDD and VSS. These power supply potentials VDD and VSS are supplied to an internal voltage generator circuit 270. The internal voltage generator circuit 270 generates various internal potentials VPP, VOD, VARY, VPERI, and the like and a reference potential ZQVREF based on the power supply potentials VDD and VSS. The internal potential VPP is mainly used in the row decoder 240, the internal potentials VOD and VARY are mainly used in the sense amplifiers included in the memory array 250, and the internal potential VPERI is used in many other circuit blocks. The reference potential ZQVREF is used in the ZQ calibration circuit 265.

The power supply terminal is also supplied with power supply potential VDDQ. The power supply potentials VDDQ is supplied to the input/output circuit 260 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 260 so that power supply noise generated by the input/output circuit 260 does not propagate to the other circuit blocks.

The calibration terminal ZQ is connected to the ZQ calibration circuit 265. The ZQ calibration circuit 265 performs a calibration operation with reference to an impedance of RZQ, and the reference potential ZQVREF, when activated by the ZQ calibration command ZQ_com. An impedance code ZQCODE obtained by the calibration operation is supplied to the input/output circuit 260, and thus an impedance of an output buffer (not shown) included in the input/output circuit 260 is specified.

According to embodiments of the present disclosure, responsive to a command provided by a memory controller (e.g., controller 10), the semiconductor device 200 may enter a training mode. In the training mode, the semiconductor device 200 may not respond to commands issued by the memory controller in the same way as when the semiconductor device 200 is in a normal operation mode. For example, the semiconductor device 200 may not write data to the memory array 250 responsive to a write command while in the training mode. When in the training mode, the semiconductor device 200 may provide an output based, at least in part, on a relationship (e.g., a phase relationship or other temporal relationship) between clock signals, such as between the data clock signals WCK_t and WCK_c and system clock signals CK_t and CK_c. When the relationship between the clock signals is not a desired relationship, the semiconductor device 200 may provide the output in one state, and may provide the output in another state when the relationship between the clock signals is the desired relationship. In some embodiments, the desired relationship may be a relationship that permits the semiconductor device 200 to generate multiphase clock signals IWCKn by internal clock circuits 230. However, in other embodiments, the desired relationship may be a relationship that permits the generation of different signals and/or proper operation of one or more other components of semiconductor device 200. In some embodiments, the semiconductor device 200 may exit the training mode responsive to a subsequent commanded received from the memory controller.

In some embodiments, a value and a mode register write command may be provided to the semiconductor device 200. The value may be written to the mode register 275 responsive to receipt of the value and a mode register write command. Responsive to the value being written to the mode register 275, the semiconductor device 200 may enter a training mode. In some embodiments, when the semiconductor device 200 is in the training mode and receives active data clock WCK_t and WCK_c signals (in addition to the system clock signals CK_t and CK_c), the semiconductor device 200 may provide an output based, at least in part, on the phase relationship between the WCK_t and WCK_c signals and CK_t and CK_c signals. The output may have one state if the system and data clock signals have a desired relationship and another state if the system and data clock signals do not have the desired relationship. In some embodiments, the output may be provided via one or more of the DQ terminals (e.g, 1, 2, 4, 8 DQ terminals). For example, the output of the one or more DQ terminals may be logic low when the relationship between the WCK_t and WCK_c signals and CK_t and CK_c signals is not the desired relationship and the output of the one or more DQ terminals may be logic high when the relationship between WCK_t and WCK_c signals and CK_t and CK_c signals is the desired relationship.

In some embodiments, the semiconductor device 200 may further receive a write command from the memory controller in the training mode. In some embodiments, the active WCK_t and WCK_c signals may be received after the write command is received. In some embodiments, the WCK_t and WCK_c signals may be toggled a non-zero number of times (e.g., 2, 3, 4, 5, 6, 7, 8, etc.) by the memory controller. In some embodiments, responsive at least in part to the mode register write command, the write command, and/or the WCK_t and WCK_c signals, the semiconductor device 200 may generate a single pulse (e.g., a single toggle) of the ICK signal. For example, clock input circuit 220 may output the ICK signal. In some embodiments, the semiconductor device 200 may compare the relationship of the pulse of the ICK signal to a state of the WCK_t and WCK_signals during some period of time of the ICK signal pulse (e.g., rising edge, plateau, and/or falling edge).

In some embodiments, the comparison of the relationship between the ICK signal pulse and the WCK_t and WCK_c signals may be indicative of a relationship between the CK_t and CK_c signals and the WCK_t and WCK_c signals. In these embodiments, the state of the output provided by the semiconductor device 200 may be based on a comparison of the ICK signal pulse and the WCK_t and WCK_c signals.

For example, in some embodiments, the output of the semiconductor device 200 may indicate the WCK_t and WCK_c signals and the CK_t and CK_c signals have a desired relationship when a rising edge of the ICK signal pulse and the rising edge of the WCK_t or WCK_c are temporally aligned (e.g., occur at or nearly the same time). In some embodiments, the output of the semiconductor device 200 may indicate the WCK_t and WCK_c signals and the CK_t and CK_c signals have the desired relationship when the WCK_t or WCK_c and the ICK signal pulse are at a high clock level at a same time-even if the corresponding toggle (e.g., the final toggle of the non-zero number of times) of the WCK_t signal and the ICK signal pulse are not at the high clock level for an entire duration of either or both of the toggle and the ICK signal pulse.

In some embodiments, the semiconductor device 200 may repeat the generation of the ICK signal pulse and comparison with the WCK_t and WCK_c signals and providing the output after a period of time. In some embodiments, the semiconductor device 200 may repeat the generation of the ICK signal pulse and comparison with the WCK_t and WCK_c signals and providing the output responsive to a subsequent write command.

In some embodiments, after comparing the ICK signal pulse and the final toggle and providing the output, the semiconductor device 200 may automatically exit the training mode. In some embodiments, the semiconductor device 200 may remain in the training mode until a subsequent mode register write command and another value are provided to the semiconductor device 200. Writing the other value to the mode register 275 responsive to the mode register write command may cause the semiconductor device 200 to exit the training mode.

In some embodiments, the training operation may be performed by the memory controller upon power-up and/or initialization of the semiconductor device 200. In some embodiments, power-up and/or initialization may be the only time at which the training operation is performed. In some embodiments, the training operation may be performed at other times, for example, responsive to a temperature change and/or a change in operating conditions. For example, optionally, semiconductor device 200 may include a temperature sensor 235. The temperature sensor 235 may monitor a temperature of the semiconductor device 200. The temperature sensor 235 may provide a temperature to the mode register 275, which may write a value indicative of the sense temperature to a register of the mode register 275 at regular intervals. If a difference between a previously written temperature and a current temperature is above a threshold, the mode register 275 may provide a temperature signal to the command decoder 215 and/or other component of semiconductor device 200. Responsive to the signal, the semiconductor device 200 may provide an output to the memory controller indicating the temperature change. The output may be provided via one or more DQ terminals and/or another terminal. Responsive, at least in part, to the temperature signal, the memory controller may initiate the training operation.

Figure 3:
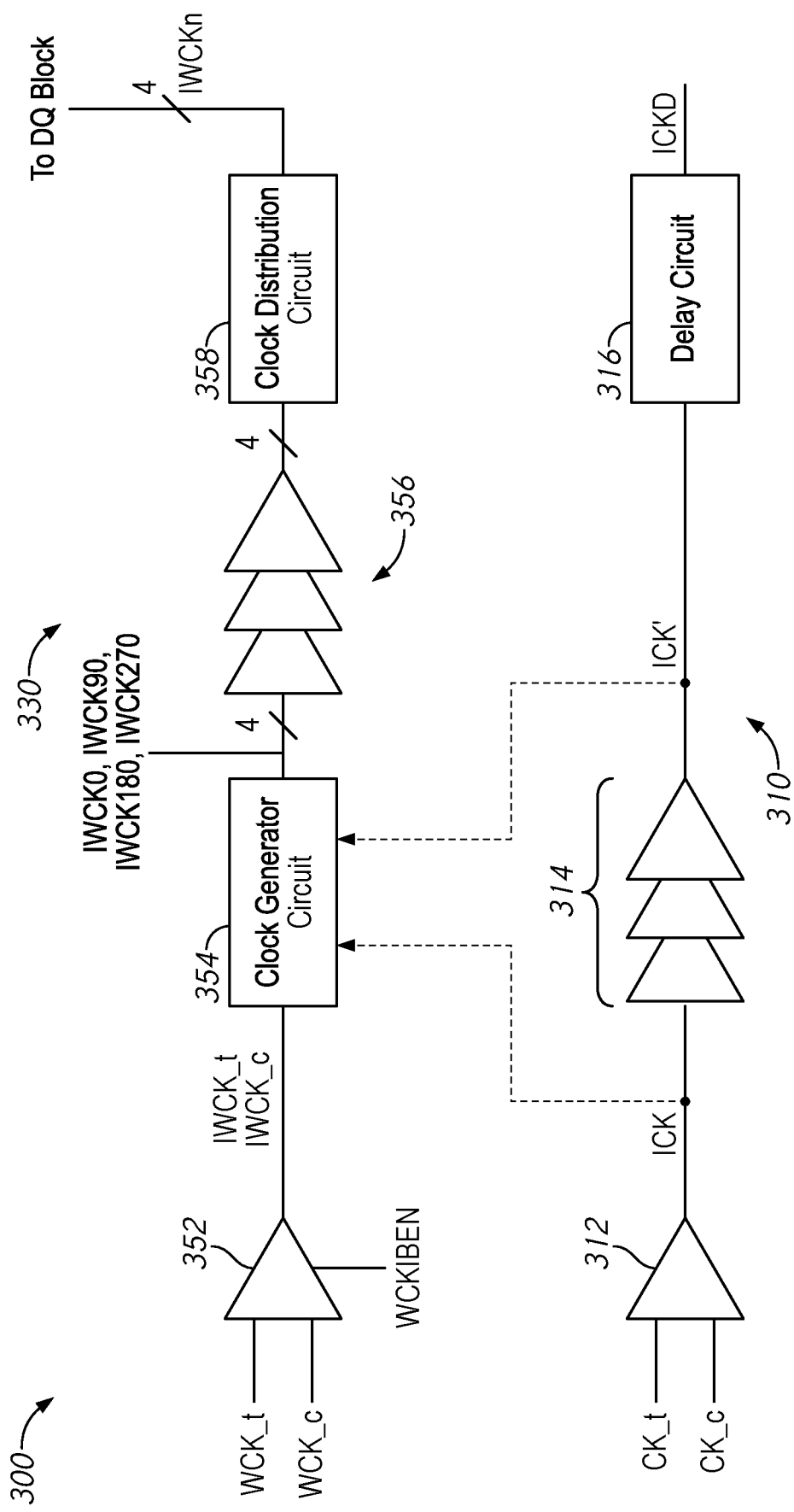
FIG. 3 is a block diagram of a clock path and a data clock path according to an embodiment of the disclosure.

FIG. 3 is a block diagram of a clock path 310 and a data clock path 330 according to an embodiment of the disclosure. The clock path 310 and data clock path 330 may be included in the semiconductor device 200 of FIG. 2 in some embodiments of the disclosure. For example the data clock path 330 may be included in the clock input circuit 220 and the internal clock circuit 230 of the semiconductor device 200 of FIG. 2. One or both of the clock path 310 and the data clock path 330 may be modified without departing from the scope of the present disclosure.

The clock path 310 may include an input buffer 312 that receives complementary clock signals CK_t and CK_c and provides an internal clock signal ICK. The input buffer 312 may be included in the clock input circuit 220 of FIG. 2. The internal clock signal ICK is based on the CK_t and CK_c clock signals. Repeater circuits 314 receive the ICK clock signal and provide an ICK' clock signal to a delay circuit 316. The repeater circuits 314 drive the ICK' clock signal over a clock line from the input buffer 312 to the delay circuit 316. The ICK' clock signal is delayed by the delay circuit 316 to provide a delayed ICK clock signal ICKD. The ICK' and ICKD signals may be used by a command path (not shown) for timing the decoding and provision of internal command signals to perform memory operations (e.g., read, write, etc.).

The data clock path 330 includes an input buffer 352. When enabled by an active enable signal WCKIBEN (e.g., active high logic level), the input buffer 352 receives complementary clock signals WCK_t and WCK_c and provides the complementary internal clock signals IWCK_t and IWCK_c based on the WCK_t and WCK_c clock signals. The input buffer 352 may be enabled, for example, by a command decoder responsive to a memory command. In an embodiment of the disclosure, the IWCK_t and IWCK_c clock signals have a same clock frequency as a clock frequency of the WCK_t and WCK_c clock signals, and the IWCK_t clock signal corresponds to the WCK_t clock signal and the IWCK_c clock signal corresponds to the WCK_c clock signal. The input buffer 352 may be included in the clock input circuit 220 of FIG. 2.

The IWCK_t and IWCK_c clock signals are provided to a clock generator circuit 354 that is configured to provide multiphase clock signals IWCK0, IWCK90, IWCK180, IWCK270 (collectively referred to as the multiphase clock signals IWCKn). In some embodiments, the multiphase clock signals have relative phases to one another, and have a clock frequency that is less than a clock frequency of the WCK_t and WCK_c clock signals (and the IWCK_t and IWCK_c signals). In some embodiments of the disclosure, the IWCK0, IWCK90, IWCK180, and IWCK270 clock signals have a clock frequency that is one-half the clock frequency of the WCK_t and WCK_c clock signals. In some embodiments, ICK and/or ICK' clock signals may be provided to the clock generator circuit 354.

In some embodiment of the disclosure, the IWCK0, IWCK90, IWCK180, and IWCK270 clock signals have a relative phase of 90 degrees to one another. For example, the IWCK90 clock signal has a phase of 90 degrees relative to the IWCK0 clock signal, the IWCK180 clock signal has a phase of 180 degrees relative to the IWCK0 clock signal (and a phase of 90 degrees relative to the IWCK90 clock signal), and the IWCK270 clock signal has a phase of 270 degrees relative to the IWCK0 clock signal (and a phase of 90 degrees relative to the IWCK180 clock signal). In such a case, the multiphase clock signals IWCK0, IWCK90, IWCK180, IWCK270 may be referred to as "quadrature" phase clock signals.

The multiphase clock signals are provided to repeater circuits 356. The repeater circuits 356 include a repeater circuit for each of the multiphase clock signals IWCKn. The repeater circuits 356 drive the multiphase clock signals IWCKn over clock lines from the clock generator circuit 354 to a clock distribution circuit 358. The clock distribution circuit 358 provides the multiphase clock signals IWCKn to various circuitries that operate according to the multiphase clock signals. For example, the multiphase clock signals IWCKn may be provided to clock input/output circuits (not shown in FIG. 3) to provide and receive data (referenced in FIG. 3 as "To DQ block").

Figure 4:
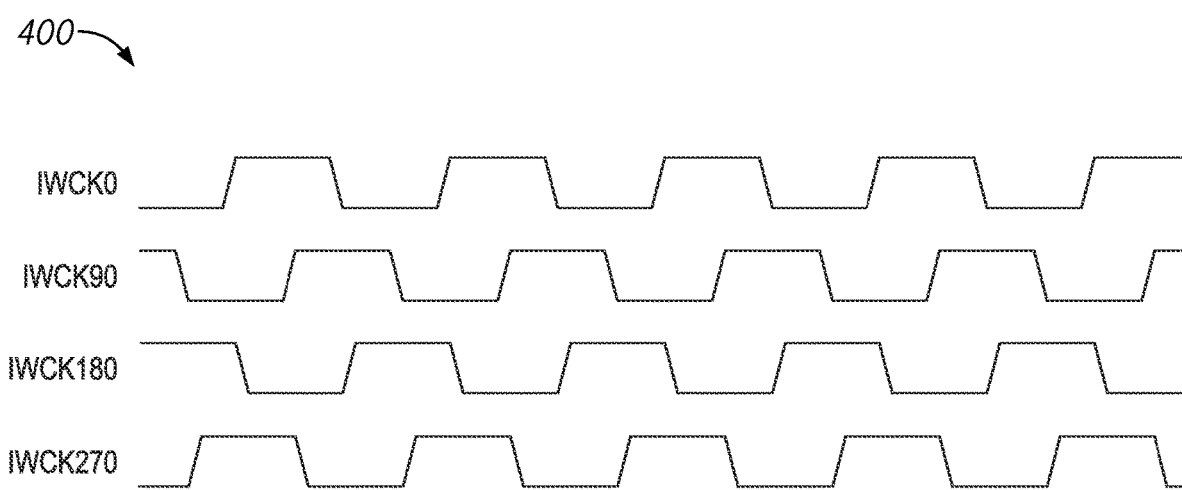
FIG. 4 is a timing diagram showing relationships between clock signals according to an embodiment of the disclosure.

The IWCK0, IWCK90, IWCK180, IWCK270 signals provided by the clock divider circuit 354 are based, at least in part on the IWCK_t and/or IWCK_c signals. The IWCK0, IWCK90, IWCK180, IWCK270 signals may have a phase relationship relative to one another that are illustrated in timing diagram 400 in FIG. 4.

In some applications, the IWCK0, IWCK90, IWCK180, IWCK270 signals are generated with the proper phase relationships—relative to one another and/or relative to other clock signals (e.g., ICK, CK_t, CK_c, WCK_t, WCK_c)—when the system clock signals CK_t and CK_c and the data clock signals WCK_t, WCK_c have a particular phase relationship. According to embodiments of the present disclosure, the phase relationship between the system clock and data clock signals to generate the proper phase relationships of the quadrature phase clock signals of the semiconductor device 200 may be achieved by a training operation performed at least in part, by a memory controller in communication with a memory.

Figure 5:
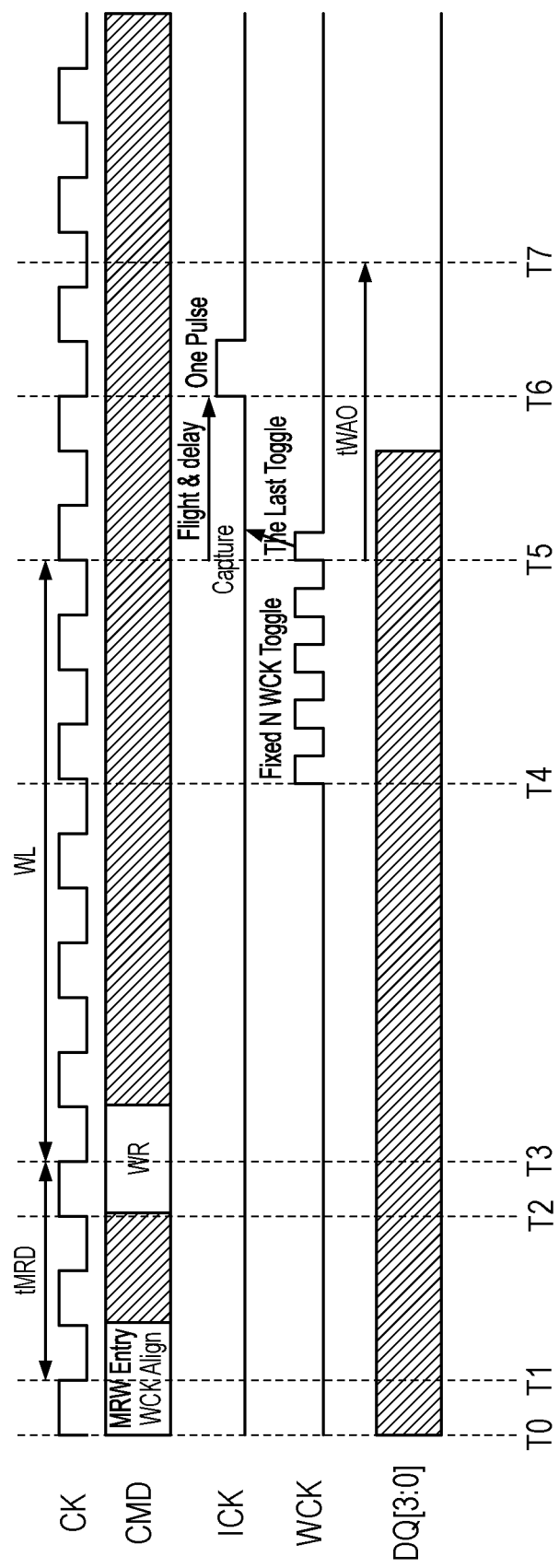
FIG. 5 is a timing diagram of a training operation according to an embodiment of the disclosure.

FIG. 5 is a timing diagram of a training operation according to an embodiment of the disclosure. The timing diagram 500 illustrates the states of various signals provided by a controller (e.g., controller 10) or a memory (e.g., memories 110(0-p), semiconductor device 200) during the training operation when system clock and data clock signals do not have a desired phase relationship. While the training operation shown in timing diagram 500 will be described with reference to the controller 10, memories 110(0-*p*), and semiconductor device 200 for explanatory purposes, the training operation shown in diagram 500 is not limited to the particular devices shown in FIGS. 1-3.

The top line of timing diagram 500 illustrates the state of a system clock CK signal, which may be provided from a memory controller (e.g., controller 10) to a memory (e.g., memory 110(0-*p*), semiconductor device 200). While the system clock CK signal may include a pair of complementary signals (e.g., CK_t and CK_c), for ease of illustration, only one of the complementary system clock signals is shown. The second line of timing diagram 500 illustrates commands provided to the memory by the memory controller (e.g., via C/A terminals and command/address input circuit 205). The third line of timing diagram 500 illustrates a state of an internal clock signal ICK of the memory, such as ICK generated by clock input circuit 220. While the internal clock ICK signal may include a pair of complementary signals (e.g., ICK_t and ICK_c), for ease of illustration, only one of the complementary internal clock signals is shown. The fourth line of timing diagram 500 illustrates the state of a data clock signal WCK signal, which may be provided from the memory controller to the memory. While the data clock WCK signal may include a pair of complementary signals (e.g., WCK_t and WCK_c), for ease of illustration, only one of the complementary data clock signals is shown. The final line of timing diagram 500 illustrates the state of DQ terminals of the memory (DQ terminals [3:0] in the example shown in FIG. 5). The DQ terminals may provide an output of the memory to the controller.

At or around time T0, the memory controller may provide a mode register write command to cause a value to be written to a mode register (e.g., mode register 275). The memory may latch the mode register write command at or around time T1. Responsive, at least in part, to the mode register write command, the memory may write the value to the mode register. This may cause the memory to enter a training mode.

At or around time T2, the memory controller may provide a write command. The memory may latch the write command at or around time T3. In some embodiments, the time between the memory controller issuing the mode register write command and the write command may be based, at least in part, on a time required for the memory to perform the mode register write command (tMRD).

At or around time T4, the memory controller may provide an active WCK signal. In some embodiments, the controller may toggle the WCK signal a fixed non-zero number of times (N). In the example shown in FIG. 5, the controller provides five toggles of the WCK signal (N=5). However, in other examples, the controller may provide a different number of toggles, which may be greater or less than five. In some embodiments, the number of toggles and/or the time between T3 and T4 is such that at least a portion of the last toggle occurs on or after time T5. The time between T3 and T5 may be based, at least in part, by a write latency (WL) of the memory.

At or around time T6, the memory may generate single pulse of the internal clock signal ICK. In some embodiments, the internal clock signal ICK pulse may be generated responsive, at least in part, to the WCK toggle provided at or around time T5. In some embodiments, the ICK pulse is provided further responsive to the write command. In some embodiments, the time between T5 and T6 is indicative of a flight delay between the CK and WCK. In some embodiments, the flight delay may be due, in part, to layout restrictions of the memory and/or memory system (e.g., memory system 105).

The memory may compare the state of the ICK signal and the WCK signal at or around time T6. Based on the comparison, the memory may provide an output at the DQ terminals at or around time T7. In some embodiments, the time between T6 and T7 is based, at least in part, on a time required by the memory to provide the result of the comparison to the DQ (tWAO). The time may be based, at least in part, on a bus turnaround time of the memory in some embodiments. In some embodiments, the controller will receive the output from the DQ terminals of the memory at or around time T7.

In the example shown in FIG. 5, the system clock CK and the data clock WCK do not have a desired relationship. In this example, this causes the memory to drive the DQ terminals at a low logic state (e.g., '0000'). However, other outputs may be used to indicate the desired relationship has not been achieved.

Figure 6:
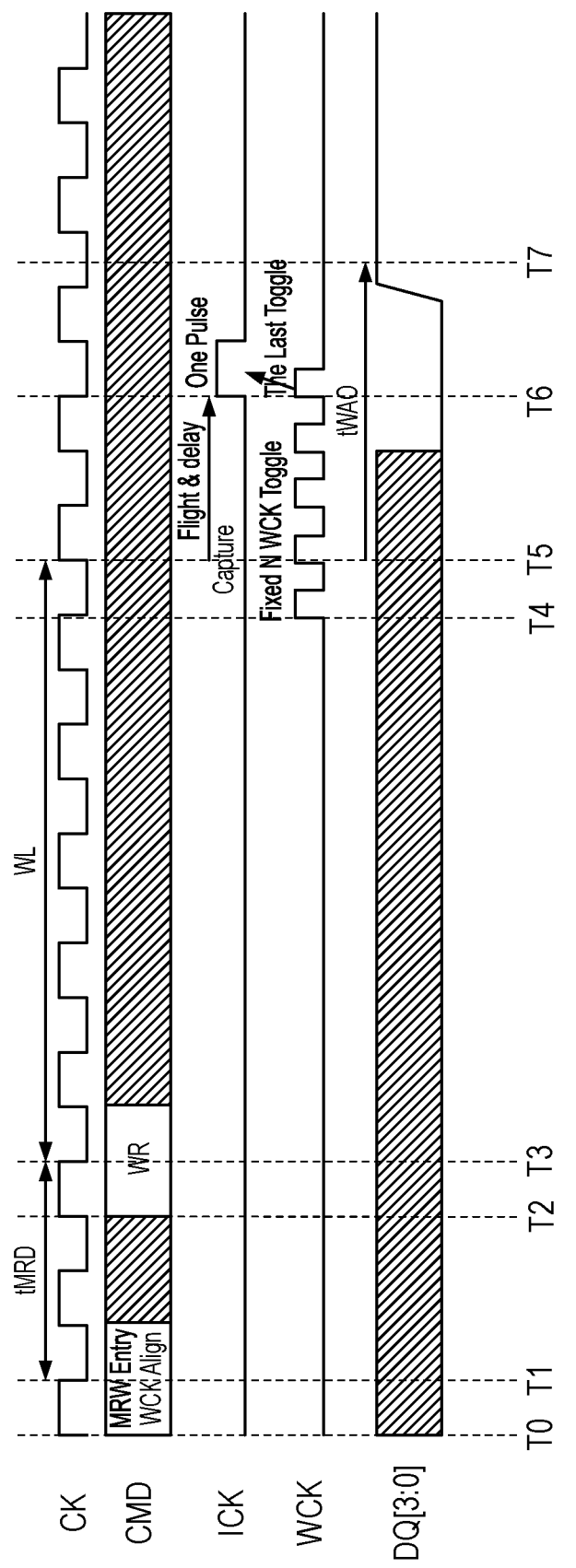
FIG. 6 is a timing diagram of the training operation according to an embodiment of the disclosure.

FIG. 6 is a timing diagram of the training operation according to an embodiment of the disclosure. The timing diagram 600 illustrates the states of various signals provided by the controller or the memory training operation when system clock and data clock signals have the desired phase relationship.

The training operation shown in timing diagram 600 may be substantially the same as the training operation shown in timing diagram 500 until time T4. As shown in timing diagram 600, the toggling of the WCK signal has been delayed to adjust a phase relationship between the WCK and the CK signals. In the example shown in FIG. 6, the second rather than the final toggle is provided at time T5. Furthermore, rather than the rising edge of a toggle aligning with time T5 (as seen in FIG. 5), time T5 coincides with the plateau of the second toggle.

At or around time T6, when the ICK pulse is issued, the rising edge of the ICK pulse coincides with the rising edge of the last toggle of the WCK signal. In some embodiments, this may indicate that a desired phase relationship between CK and WCK has been achieved. In some embodiments, the tolerance of the phase relationship between CK and WCK may be higher, and the presence of a rising edge and/or the plateau of a WCK toggle at or around time T6 may indicate that the desired phase relationship between CK and WCK has been achieved.

Similar to timing diagram 500, the memory may compare the state of the ICK signal and the WCK signal at or around time T6 of timing diagram 600. Based on the comparison, the memory may provide an output at the DQ terminals at or around time T7. As noted, in the example shown in FIG. 6, the system clock CK and the data clock WCK have the desired relationship. In this example, this causes the memory to drive the DQ terminals to a high logic state (e.g., '1111'). However, other outputs may be used to indicate the desired relationship has been achieved.

Although not shown in timing diagrams 500 and 600, once the desired relationship between CK and WCK has been achieved, the controller may issue a subsequent mode register write command to the memory to cause another value to be written to the mode register. Responsive to writing the other value in the mode register, the memory may exit the training mode.

Figure 7:
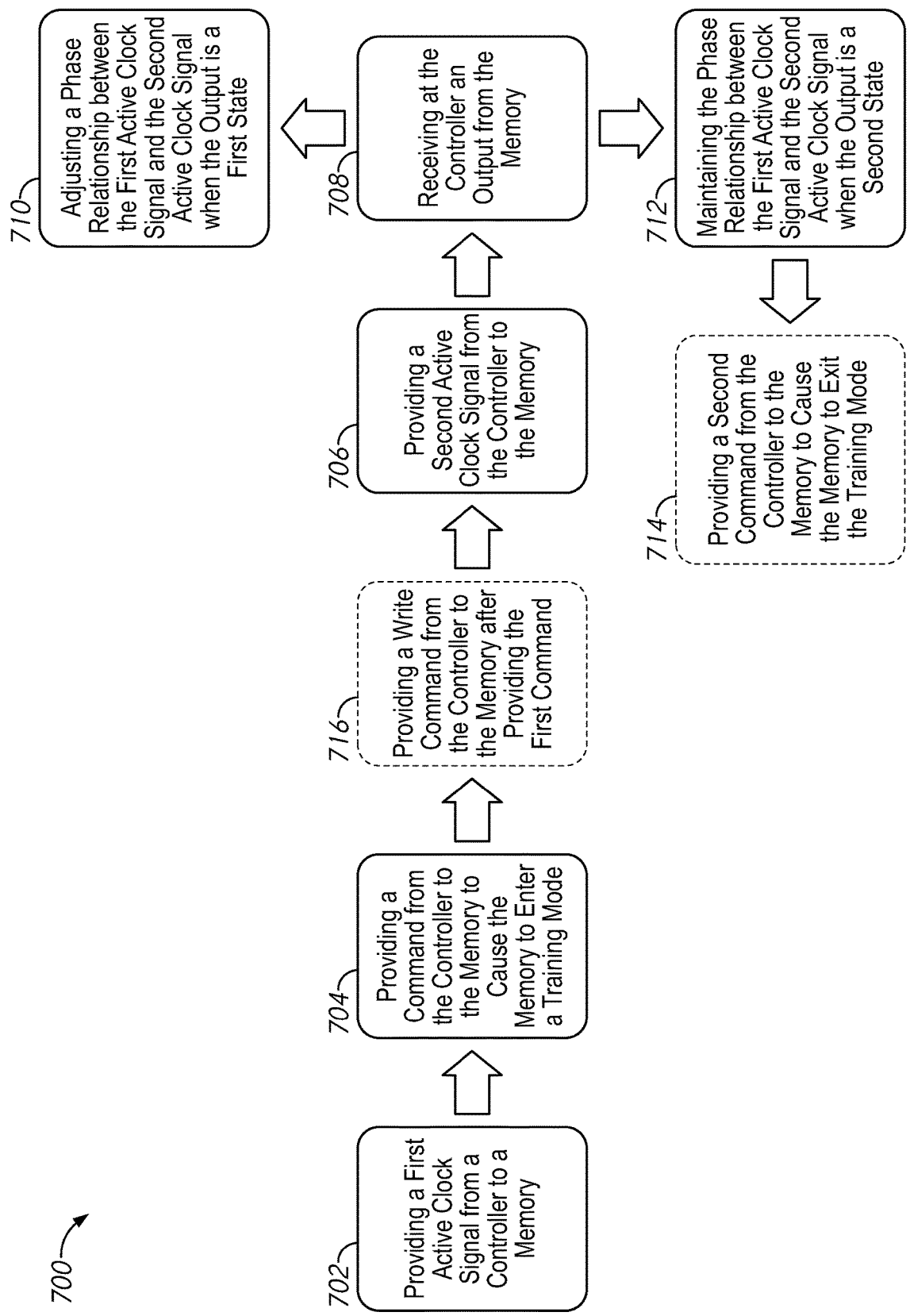
FIG. 7 is a flow chart of a method according to an embodiment of the disclosure.

FIG. 7 is a flow chart of a method according to an embodiment of the disclosure. The method in flow chart 700 may be performed, at least in part, by a controller, such as controller 10 in some embodiments.

At block 702, "providing a first active clock signal from a controller to a memory" may be performed. In some embodiments, the memory may include any or all of memories 110(0-p) and/or semiconductor device 200. In some embodiments, the first active clock signal may be system clock signal (e.g., CK_t, CK_c).

At block 704, "providing a command from the controller to the memory to cause the memory to enter a training mode" may be performed. In some embodiments, the command may be a mode register write command. In some embodiments, the command is provided responsive to a power-up of the memory, an initialization of the memory, or a combination thereof. In some embodiments, the command is provided responsive to a change in an operating condition of the memory (e.g., change frequency set point). In some embodiments, the command is provided responsive to a temperature signal received by the controller from the memory.

At block 706, "providing a second active clock signal from the controller to the memory" may be performed. In some embodiments, the second active clock signal may be a data clock signal (e.g., WCK_t, WCK_c). In some embodiments, the second active clock signal may have a frequency different than the first active clock signal. In some embodiments, the second active clock signal may have a higher frequency (e.g., 2×, 4×) than the first active clock signal. In some embodiments, second active clock signal comprises a whole non-zero number of toggles.

At block 708, "receiving at the controller an output from the memory" may be performed. In some embodiments, the output may be received from DQ terminals of the memory (such as DQ terminals shown in FIG. 2). In some embodiments, the output may be received via a data bus (e.g., data bus 125 of FIG. 1).

At block 710, "adjusting a phase relationship between the first active clock signal and the second active clock signal when the output is a first state" may be performed or alternatively, at block 712 "maintaining the phase relationship between the first active clock signal and the second active clock signal when the output is a second state" may be performed.

At block 714 "providing a second command from the controller to the memory to cause the memory to exit the training mode" may be performed. In some embodiments, block 714 may be performed after block 712. In some embodiments, when block 710 is performed, blocks 702, 704, 706, and/or 708 may be repeated.

In some embodiments, block 716 is performed, which includes "providing a write command from the controller to the memory after providing the first command." In some embodiments, block 716 may be performed prior to block 706. In other embodiments block 706 may be performed, or performance of block 706 may begin, prior to or concurrently with block 716.

Figure 8:
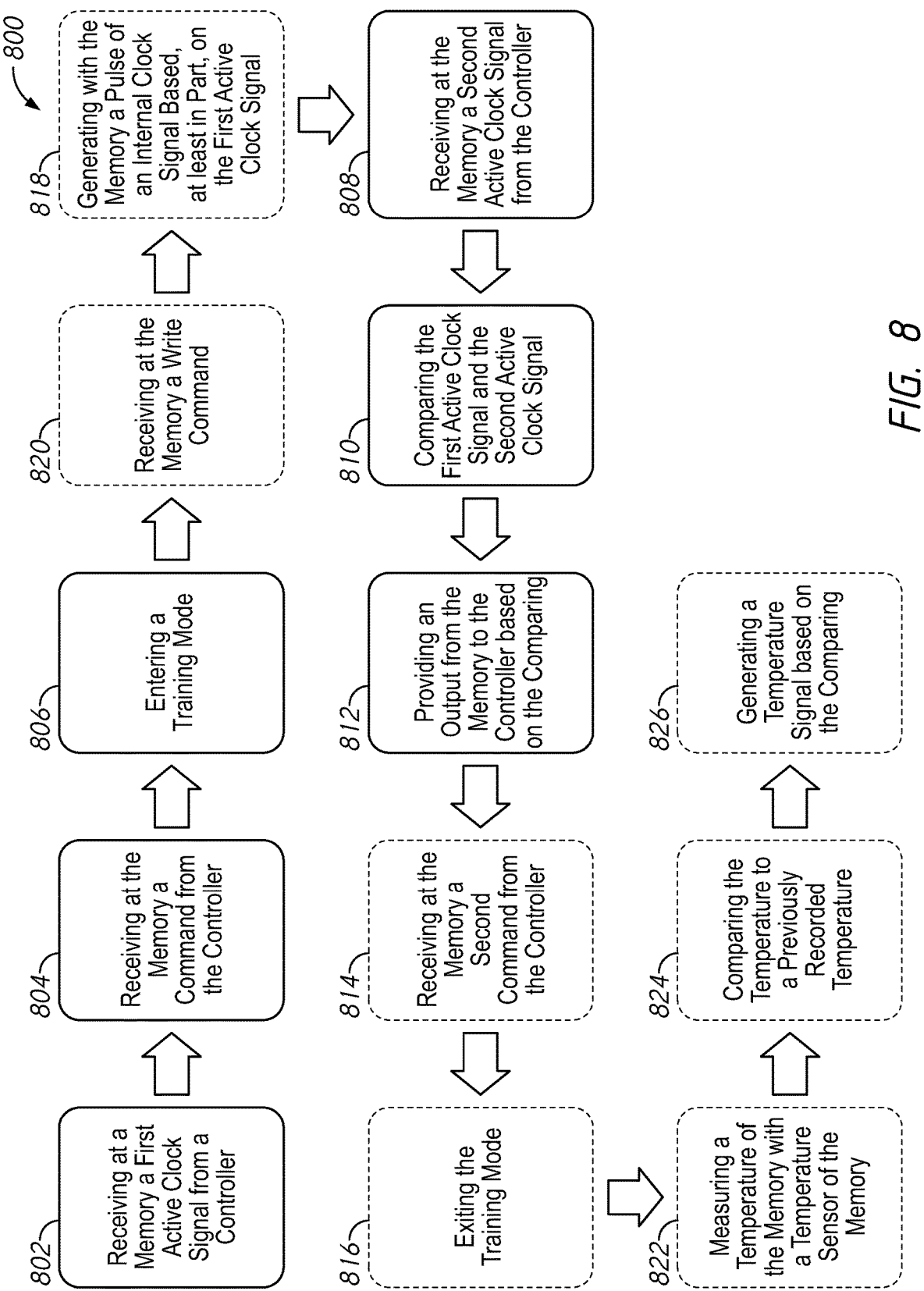
FIG. 8 is a flow chart of a method according to an embodiment of the disclosure.

FIG. 8 is a flow chart of a method according to an embodiment of the disclosure. In some embodiments, the method of flowchart 800 may be performed, at least in part, by one or more memories, such as memories 110(0-p) and semiconductor device 200.

At block 802, "receiving at a memory a first active clock signal from a controller" may be performed. The controller may be controller 10 in some embodiments.

At block 804, "receiving at the memory a command from the controller" may be performed. In some embodiments, the command is a mode register write command, the method further includes writing a value to a mode register of the memory responsive to the mode register write command.

At block 806, responsive, at least in part, to the command, "entering a training mode" may be performed.

At block 808, "receiving at the memory a second active clock signal from the controller" may be performed. In some embodiments, receiving the second active clock signal includes receiving a number of toggles of the second active clock signal.

At block 810, "comparing the first active clock signal and the second active clock signal" may be performed.

At block 812 "providing an output from the memory to the controller based on the comparing" may be performed. In some embodiments, the output may be provided to data terminals of the memory. In some embodiments, the data terminals may be coupled to a data bus, such as data bus 125. The output may include a first state when the first active clock signal and the second active clock signal have a first phase relationship and the output may include a second state when the first active clock signal and the second active clock signal have another phase relationship.

At block 814, "receiving at the memory a second command from the controller" may be performed and responsive to the second command, at block 816, "exiting the training mode" may be performed. Optionally, in some embodiments, after block 816, generating quadrature phase clock signals based, at least in part, on the first active clock signal, the second active clock signal, or a combination thereof may be performed.

In some embodiments, block 818 is performed, which includes "generating with the memory a pulse of an internal clock signal based, at least in part, on the first active clock signal." In these embodiments, comparing the relationship of the first active clock signal and the second active clock signal in block 810 includes comparing a relationship of the pulse to the second active clock signal. In some embodiments, the method shown in flowchart 800 further includes "receiving at the memory a write command" as indicated by block 820 prior to block 818, and the pulse is generated responsive, at least in part, to the write command. Although blocks 818 and 820 are shown prior to block 808, in some embodiments, block 818 and/or block 820 may be performed after or concurrently with block 808.

Optionally, the method shown in flowchart 800 further includes "measuring a temperature of the memory with a temperature sensor of the memory" as indicated by block 822. In some embodiments, the temperature sensor may include temperature sensor 235. The method may further include "comparing the temperature to a previously recorded temperature" as indicated by block 824 and "generating a temperature signal based on the comparing" as indicated by block 826. While shown at the end of the method in flow chart 800 in FIG. 8, these optional steps may be performed prior to or after the method shown in flowchart 800.

Training operations as disclosed herein may be performed to establish a desired relationship between the system clock signals and the data clock signals. In some embodiments, the desired relationship may be a phase or other temporal relationship that permits a memory operate properly. The training operations disclosed herein may utilize a memory controller to adjust a relationship between clock signals provided to the memory, and the memory may provide an output indicating when the desired relationship has been achieved. In some embodiments, the training operations may reduce or eliminate clock synchronization operations performed by the memory. In some embodiments, the training operations as disclosed herein may only be performed at power-up and/or initialization of the memory and/or when there is a change in operating conditions of the memory. Thus, the training operation may be performed less often than clock synchronization operations performed by the memory. In some applications, this may improve performance of the memory, for example, by increasing an amount of time the memory is available to perform other operations (e.g., read/write operations).

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. A method comprising:
   providing a first active clock signal from a controller to a memory;
   providing a command from the controller to the memory to cause the memory to enter a training mode;
   providing a second active clock signal from the controller to the memory;
   receiving at the controller an output from the memory; and
   adjusting a phase relationship between the first active clock signal and the second active clock signal when the output is a first state; or
   maintaining the phase relationship between the first active clock signal and the second active clock signal when the output is a second state.

2. The method of claim 1, further comprising providing a second command from the controller to the memory to cause the memory to exit the training mode.

3. The method of claim 1, wherein the command comprises a mode register write command.

4. The method of claim 1, wherein the first active clock signal comprises a system clock signal and the second active clock signal comprises a data clock signal.

5. The method of claim 1, wherein the first active clock signal is a first frequency and the second active clock signal is a second frequency different from the first frequency.

6. The method of claim 1, wherein the second active clock signal comprises a whole non-zero number of toggles.

7. The method of claim 1, further comprising providing a write command from the controller to the memory after providing the command, wherein the write command is provided prior to providing the second active clock signal.

8. The method of claim 1, wherein the command is provided responsive to a power-up of the memory, an initialization of the memory, a change in an operating condition of the memory, a temperature signal received by the controller from the memory, or a combination thereof.

9. The method of claim 1, further providing an active chip select signal from the controller to the memory.

10. A method comprising:
    providing a first active clock signal from a controller to a memory;
    providing a mode register write command and a value from the controller to the memory;
    providing a number of toggles of a second active clock signal from the controller to the memory;
    receiving an output from the memory at the controller; and
    responsive to a state of the output, adjusting or maintaining a phase relationship between the first active clock signal and the second active clock signal.

11. The method of claim 10, wherein adjusting the phase relationship comprises delaying the second active clock signal.

12. The method of claim 10, further comprising providing a write command from the controller to the memory after the mode register write command.

13. The method of claim 12, wherein a time period between providing the mode register write command and the write command is based, at least in part, on a time required by the memory to perform a mode register write operation.

14. The method of claim 12, wherein the number of toggles of the second active clock signal are provided after the write command, and a time period between providing the write command and the number of toggles is based, at least in part, on a write latency of the memory.

15. The method of claim 10, wherein the number of toggles of the second active clock signal is based, at least in part, on a write latency of the memory.

16. An apparatus comprising:
    a controller configured to provide clock signals and commands to a memory, the controller further configured to:
    provide a first active clock signal to the memory;
    provide a command the memory to cause the memory to enter a training mode;
    provide a second active clock signal to the memory;
    receive an output from the memory; and
    adjust a phase relationship between the first active clock signal and the second active clock signal when the output is a first state; or
    maintain the phase relationship between the first active clock signal and the second active clock signal when the output is a second state.

17. The apparatus of claim 16, wherein the second active clock signal comprises a non-zero whole number of toggles.

18. The apparatus of claim 16, wherein the controller is further configured to provide a second command to the memory to cause the memory to exit the training mode.

19. The apparatus of claim 16, wherein the first active clock signal has a lower frequency than a frequency of the second active clock signal.

20. The apparatus of claim 16, wherein the controller is configured to provide the command responsive to a power-up of the memory, an initialization of the memory, or a combination thereof.

* * * * *